(12) United States Patent
Foroudi et al.

(10) Patent No.: US 6,433,611 B1
(45) Date of Patent: Aug. 13, 2002

(54) VOLTAGE LEVEL SHIFTING CIRCUIT

(75) Inventors: Navid Foroudi; John N. M. Peirce, both of Ottawa (CA)

(73) Assignee: SiGe Microsystems Inc., Ottawa (CA)

( * ) Notice: Subject to any disclaimer, the term of this patent is extended or adjusted under 35 U.S.C. 154(b) by 0 days.

(21) Appl. No.: 09/534,083

(22) Filed: Mar. 24, 2000

(51) Int. Cl.[7] .............................................. H03L 5/00
(52) U.S. Cl. ........................... 327/333; 327/52; 327/170
(58) Field of Search .......................... 327/333, 52, 170, 327/374; 326/89, 92

(56) References Cited

U.S. PATENT DOCUMENTS

| | | | |
|---|---|---|---|
| 4,942,320 A | | 7/1990 | Itoh et al. ....................... 326/9 |
| 5,045,810 A | * | 9/1991 | Perround et al. ............ 330/293 |
| 5,530,242 A | * | 6/1996 | Genovese ................... 250/234 |
| 5,684,414 A | | 11/1997 | Linebarger et al. .......... 326/126 |
| 5,883,910 A | | 3/1999 | Link ............................ 327/34 |
| 6,018,261 A | | 1/2000 | Alford et al. ................ 327/312 |

FOREIGN PATENT DOCUMENTS

GB 2 341 246 3/2000

* cited by examiner

*Primary Examiner*—Toan Tran
*Assistant Examiner*—Quan Tra
(74) *Attorney, Agent, or Firm*—Freedman & Associates

(57) ABSTRACT

An integrated level shifter circuit converts an input signal having a first voltage potential to an output signal having a second voltage potential. The level shifter circuit provides circuit operation between the sections when the voltage potential of the input logic signal is converted to the output logic signal having lower voltage potential. For logic signals transmitted between sections of an integrated circuit operating with different supply voltages. The level shift circuit for each input includes two transistors and a voltage divider circuit having two resistors in series. The values of the resistors are selected to yield a desired output voltage at a node between the two resistors. In effect, the resistors lessen a full 0.9 volt diode drop to yield a level shift which is a fraction of a diode drop. A capacitor in parallel with the resistor provides a path for AC signals and increases both the speed and bandwidth of the level shifter.

16 Claims, 9 Drawing Sheets

VOLTAGE LEVEL SHIFTING CIRCUIT

FIELD OF THE INVENTION

This invention relates in general to voltage level shifting and more particularly to introducing a variable common-mode DC level offset for a wideband AC signal.

BACKGROUND OF THE INVENTION

Level shift circuits which are necessary in digital circuits that belong to high-speed, differential logic families such as emitter coupled logic (ECL) or current mode logic (CML) are well known. U.S. Pat. No. 6,018,261 incorporated herein by reference, describes a requirement for such a circuit.

Earlier prior art level shift circuits provide a wideband solution for obtaining a full diode voltage (Vbe) drop in the common-mode direct current (DC) voltage level of alternating current (AC) input signals. Typical circuits that require such a level shift circuit are shown in FIGS. 1A and 1B and are described in prior art U.S. Pat. No. 6,018,261. The emitter coupled logic latch shown in FIG. 1A requires differential clock input signals (CLK, CLKX) whose common-mode DC voltage must be shifted down from the common-mode DC voltage of the differential data input signals (D, DX) for proper circuit operation to occur. In particular, for the latch shown in FIG. 1A, the base to collector junctions of devices connected to the clock inputs CLK and CLKX would be forward biased if the common-mode DC level of the differential clock input signals were not shifted down from the common-mode DC level of the data inputs D and DX. Thus, it becomes necessary to lower the common-mode DC level of the clock input signals CLK and CLKX to a low enough potential to avoid forward biasing the base to collector junctions of the current steering transistors. A more complex situation exists where three bias levels are required is shown in FIG. 1B.

One typical circuit, which has been extensively used to lower the common-mode DC level of an AC signal, is the emitter follower circuit shown in prior art FIG. 2. This type of circuit has been developed to lower the common-mode DC voltage level of the clock input signals by an amount equal to a full base to emitter voltage drop for a given bias current. Since the common-mode DC level of the incoming clock signals at terminals INO and INOX is approximately at the supply voltage, the emitter follower circuit lowers the common-mode DC level of the clock signals at terminals Q1 and Q1X by a full diode drop below the supply voltage. An alternative configuration for obtaining a full diode drop level shift without limiting the input signal's AC bandwidth is shown in prior art FIG. 4. This approach uses the path through a high-speed differential buffer to maintain high output signal bandwidth. In this approach, a diode connected bipolar transistor Q4 having its collector and base shorted is used to drop the differential buffer's supply voltage by a full diode drop or by about 0.9 volts. Thus, the common-mode DC level of the output signals appearing at terminals CLK_OUT and CLK_OUTX is shifted down by a full diode drop from the input signals.

The problem with the full diode drop level shift circuits identified in FIG. 2 and FIG. 4 and described in U.S. Pat. No. 6,018,261 is that the present design environment for integrated circuits requires circuit operation in the presence of supply voltages as low as 1.8 volts DC for circuits with two DC bias levels such as the latch in FIG. 1A. A similar requirement is for circuits with three bias levels, such as the circuit in FIG. 1B, to operate at 2.7 volts. In a contemporary, bipolar process, a base to emitter diode voltage drop is approximately 0.9 volts for active devices that are biased for high-speed operation. When the supply voltage is lowered to 1.8 volts and the common-mode DC level of the clock input signals is shifted down by 0.9 volts through the use of the full diode drop level shift circuits illustrated in FIG. 2 or FIG. 4, the resulting common-mode DC level of the signals appearing at terminals CLK and CLKX of FIG. 1A is 0.9 volts below the 1.8 volt supply voltage, i.e. 0.9 volts. Again, since a base to emitter voltage drop is around 0.9 volts, the DC voltage level present at the emitters of devices Q2 and Q3 in FIG. 1A will be approximately zero volts.

Thus, the collector to emitter voltage of the current sinking transistor, Q1 in FIG. 1A, will also be approximately zero volts. In the presence of the required bias voltage of around 0.9 volts at the base of transistor Q1, the base to collector voltage Q1 would be sufficiently high to forward bias this junction, and Q1 would be in saturation and would not act as a current sink. Therefore, it is not possible to operate digital circuits that belong to high-speed, differential logic families such as emitter coupled logic (ECL) or current mode logic (CML) with traditional full diode drop level shift circuits when operating with supply voltages as low as 1.8 volts.

FIG. 1A can be treated as an output circuit consisting of a pair of resistors R1 and R2 with equal value resistance. One terminal of each resistor is connected to a supply voltage (Vdd). The remaining terminals OUT and OUTX of the resistors are driven by a pair of linked bi-value currents I1 and I2. When I1 is at value I, I2 is at value 0. Conversely, if I2 is at value I, I1 is at value 0. In this way, a logic signal is defined between terminals OUT and OUTX of the circuit. Logic HIGH is defined when the voltage at terminal OUT is approximately equal to Vdd while the voltage at OUTX is approximately equal to Vdd-Vlogic, where Vlogic is the product of resistor value R and current value I. Logic LOW is defined when the voltage at terminal OUTX is approximately equal to Vdd while the voltage at OUT is approximately equal to Vdd-Vlogic. Typically Vlogic is defined with value sufficiently large to steer substantially all the current in a bipolar diffamp to one collector of the amplifier but small compared to a silicon diode voltage. A typical value is 200 millivolts (mV).

FIG. 1B is a typical input circuit illustrating logic with three DC bias levels. The circuit consists of differential amplifiers (devices Q11 through Q16) stacked to form an AND gate. The output voltage is generated by drawing current through differential load resistors R3 and R4. The circuit is biased by source Q7 with fixed value I. Logic levels at the output are defined in the same manner as in the transmitting circuit. As seen in the figure, output terminal AND is at logic HIGH only when terminal A is at high potential compared to AX, B is at high potential compared to BX and C is at high potential compared to CX.

The need for level shifting the inputs to the receiving circuit is demonstrated by studying the DC voltage constraints at the inputs to the receiving circuit. If the transmitting circuit is coupled to terminals A and AX, acceptable performance can be achieved. If it is assumed that terminals A and AX are excited by a voltage between Vdd and Vdd-Vlogic, application of similar voltages to terminals B and BX results in saturation of devices Q13 and Q14. This results in slow or incorrect circuit operation. Clearly the DC level of the voltages applied to terminals B and BX must be shifted down with respect to the voltages applied at A and AX by at least Vsat, the minimum voltage applied across a bipolar collector-emitter junction to keep that device from saturating. Similarly, the voltages at terminals C and CX must be below the voltages at B and BX by at least Vsat. At the same time, the logic definitions of the signals must be preserved. For these operations a level shift circuit is required.

As discussed above, the problem with the full diode drop level shift circuits identified in FIG. 2 and FIG. 4 is that the present design environment for integrated circuits requires supply voltages to be minimized. In a contemporary, small-geometry bipolar process, a base to emitter diode voltage drop is approximately 0.9 volts for active devices at room temperature that are biased for high speed operation. Using full diodes for level shifts and assuming a Vsat of 0.4 volts, the minimum voltage Vdd applied required for correct circuit operation in FIG. 1B is 3.1 volts at room temperature. For a circuit such as FIG. 1A with only two inputs a supply voltage of 2.2 volts is required. To meet industry supply voltage standards, it is desirable to operate at voltages as low as 2.7 volts with 3 levels of logic and 1.8 volts with 2 levels of logic.

A solution to this problem is to create a level shift circuit that produces a DC level shift that is a fraction of a diode drop. In that way, three-level logic could be supported by coupling an CML transmitting signal directly to the A inputs of a receiver, through the fractional diode level shifter to the B inputs of the receiver and though a full-diode level shifter to the C inputs of the receiver. For two-level logic, only the A and B connections would be required.

A fractional-diode level shift circuit would behave optimally if the level shift voltage is set to ½ Vbe and maintained at that value. This can be seen by returning again to the receiving circuit in FIG. 1B. Assume that input pairs A, B and C are driven by 0, F and 1 diode level shifts, respectively, where F is a fraction between 0 and 1. If F is greater than 0.5, this moves transistors Q15 and Q16 closer to or into saturation. If F is less than 0.5, this moves transistors Q13 and Q14 closer to or into saturation. Maximum immunity to device saturation on both Q13, Q14 and Q15, Q16 is achieved when F is at 0.5. Since diode voltage Vbe is a function of temperature, the level shift voltage (F)(Vbe) should track in proportion to Vbe with temperature for optimal performance.

One way to avoid having to lower the clock input signal's common-mode DC voltage by the full 0.9 volt diode drop is shown in prior art FIG. 3. This circuit uses R1 and R2 to lower the common-mode DC level of the input signal by an arbitrary fraction of a base to emitter voltage drop. Resistors R1 and R2 form a voltage divider which sub-divides the voltage between the base and emitter of Q1. Since the circuit produces a voltage drop that is some fraction of a full base to emitter voltage drop, it is referred to herein as a sub-Vbe level shifting circuit. When a 1.8 volt supply is used, dropping the voltage by 0.45 volts instead of 0.9 volts allows the latch in FIG. 1A to operate correctly.

An inherent problem with the circuit illustrated in FIG. 3 is a significant reduction in circuit speed and bandwidth due to the presence of a large time constant directly in the signal path. This occurs because resistors R1 and R2 must be made large enough not to sink substantial current from previous stages. This large resistance, together with the input capacitance of the transistors in the next stage, forms a long time constant relative to the period of the incoming signals. An example of this scenario might be a contemporary IC process for which a minimum-sized NPN transistor's base transit time is 9.9 pS and for which the maximum transition frequency ($F_t$) has been found to occur at a collector bias current of 200 $\mu$A. In this situation and referring to FIG. 3, the base charging capacitance of Q1 would be approximately 75 fF and would dominate the maximum useful frequency of the device. Assuming that only 20 uA is to flow through R1 and R2 from the previous stage, then the values selected for R1 and R2 each will be about 33 K Ohms. With this value of resistance attached to the base terminal, the corner frequency would be only approximately 32 Mhz at the input of the sub-Vbe level shift circuit. This frequency response is not adequate for the present high frequency design environment around 3–4 GHz.

Therefore, the need exists for a circuit configuration for application as a DC level offset for wideband AC signals. Traditional full diode drop level shifting circuits do not work with ECL and CML logic structures at low supply voltages. Thus, it would be desirable to have a circuit, which would provide a fraction of a diode voltage drop DC voltage offset from a supply voltage or potential without limiting the bandwidth of the wideband signals.

In an attempt to overcome the limitations of the prior art circuit of FIG. 3, U.S. Pat. No. 6,018,261 provides a somewhat complex solution to providing a circuit, which has a fraction of a diode voltage drop DC voltage offset from a supply voltage and which overcomes the significant reduction in circuit speed and bandwidth.

Referring now to the prior art circuit of FIG. 5, a block diagram illustrating an embodiment of the sub-Vdd voltage offset circuit is shown generally at 100. This circuit 100 is generally used for transmitting a lock signal from a transmitting circuit to a receiving circuit. As is well known in the art, a "signal" may be defined by referring to FIG. 1A discussed herein.

To illustrate its operation of the circuit of FIG. 5 disclosed in U.S. Pat. No. 6,018,261, an input voltage or bias 101 is applied to bias sub-Vbe reference 103 and to bias a comparator circuit 105. The output of the sub-Vbe reference 103 is set to a voltage which is less than the supply voltage (Vdd) by some fraction of a diode voltage drop (Vbe). Typically, the supply voltage Vdd is approximately 1.8 volts. P-channel MOSFET transistor 107 is connected to the output of the comparator circuit 105 and sources current from supply voltage Vdd to a sub-Vdd reference point 109 and comparator input 108 to close a feedback control loop. Comparator 105 controls the gate to source voltage of transistor 107 such that the voltage at the sub-Vdd reference point 109 is held at approximately the same voltage as the output voltage of the sub-Vbe reference 103 over variations in load current drawn through transistor 107. The sub-Vbe circuit 100 operates by creating a voltage source whose output current and voltage appear at sub-Vdd reference point 109 and whose voltage is an arbitrary fraction of a diode voltage drop (Vbe) lower than the supply voltage Vdd.

Although this circuit appears to perform its intended function, it appears to be complex and costly to manufacture. Furthermore it does not provide the ability to dispose the level shifter at any desired location in a desired path within the circuit topology since the level shifter in FIG. 5 is combined with a gate.

It is an object of this invention to provide voltage level shift circuit that is inexpensive to implement using a conventional integrated circuit process.

It is therefore an object of this invention to provide a significant improvement to the circuit shown in FIG. 3, which greatly lessens the inherent problems associated with speed and bandwidth that were mentioned heretofore.

SUMMARY OF THE INVENTION

In accordance with the invention there is provided, a voltage level shifting circuit for use with an alternating current signal for providing a voltage offset up to a portion of a full diode voltage drop below a supply voltage, comprising: an input terminal for receiving the alternating current signal; a first and a second transistor connected in series, the first transistor having a collector, a base and an emitter, the base of the first transistor being connected to or serving as the input terminal, the second transistor being electrically coupled with the emitter of the first transistor, the base of the first transistor being coupled to the second transistor via a first and a second resistor in series forming a voltage divider network, the first resistor connected to the base of the first transistor, a node between the two resistors being an output terminal; and, a capacitor connected in parallel with one of the resistors.

In accordance with the invention a voltage level shifting circuit is provided comprising: a first transistor having a collector, a base and an emitter, the collector for being coupled to a supply voltage, the base serving an input for an input signal to be level shifted; a voltage divider circuit coupled between the base and the emitter of the first transistor and having a node therebetween serving as an output node; a capacitor for reducing high frequency impedance in parallel with a portion of the voltage divider circuit.

In accordance with the invention there is further provided, a current-mode level shifting circuit comprising: a first and a second input terminal; a first and a second transistor each having a collector, a base and an emitter, the collectors of the two transistors being coupled to a common voltage terminal, the base of the first and second transistor being coupled to the first and second input terminal respectively: the base of each of the first and second transistor being coupled to a voltage divider circuit, each voltage divider circuit comprising a first and a second resistor in series between the respective base and emitter of respective transistors, a node between each first and second resistors in series being output nodes; and, each voltage divider having a capacitor connected in parallel with one of the first and second series resistors.

BRIEF DESCRIPTION OF THE DRAWINGS

Exemplary embodiments of the invention will now be described in conjunction with the drawings in which.

DETAILED DESCRIPTION

Figure 1A:
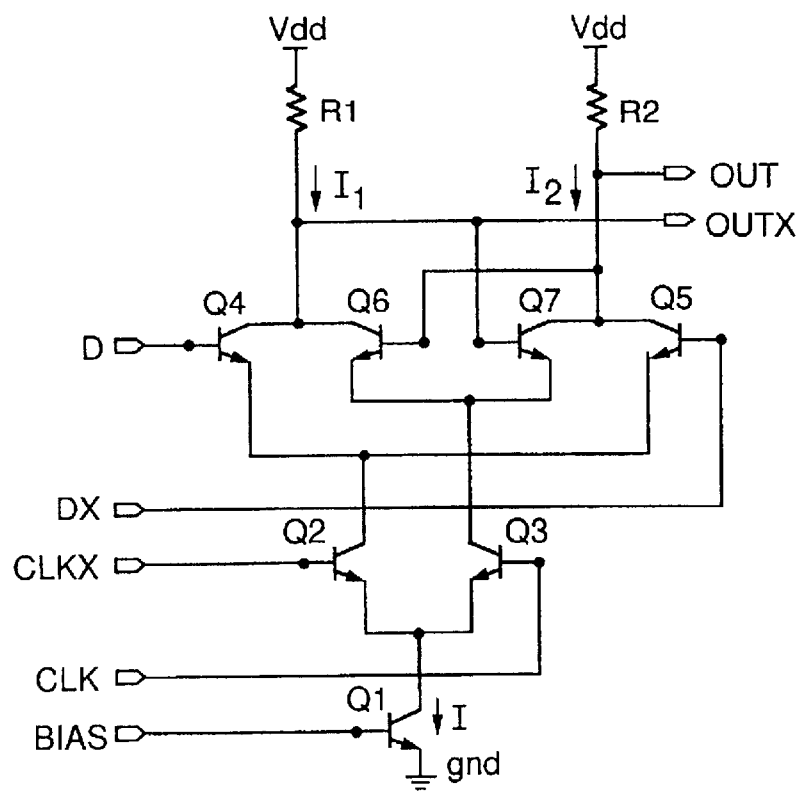
FIGS. 1a and 1b are prior art schematic diagrams showing an ECL or CML latches used in transmitting and receiving circuits indicating the need for level-shirt circuits.
Figure 1B:
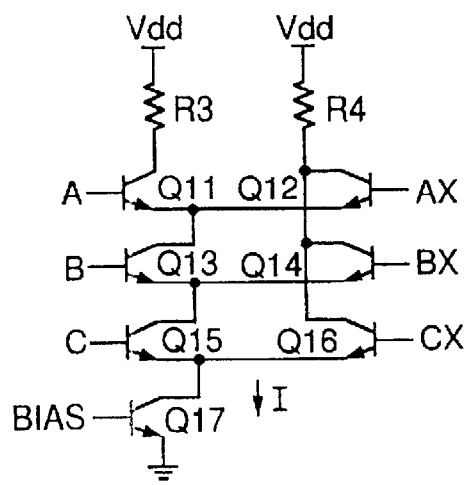
Figure 2:
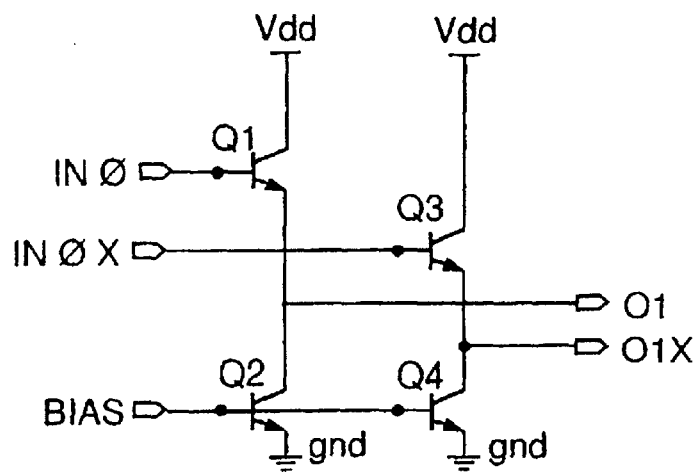
FIG. 2 is prior art schematic showing a traditional full diode drop level shift circuit for differential AC signals.
Figure 3:
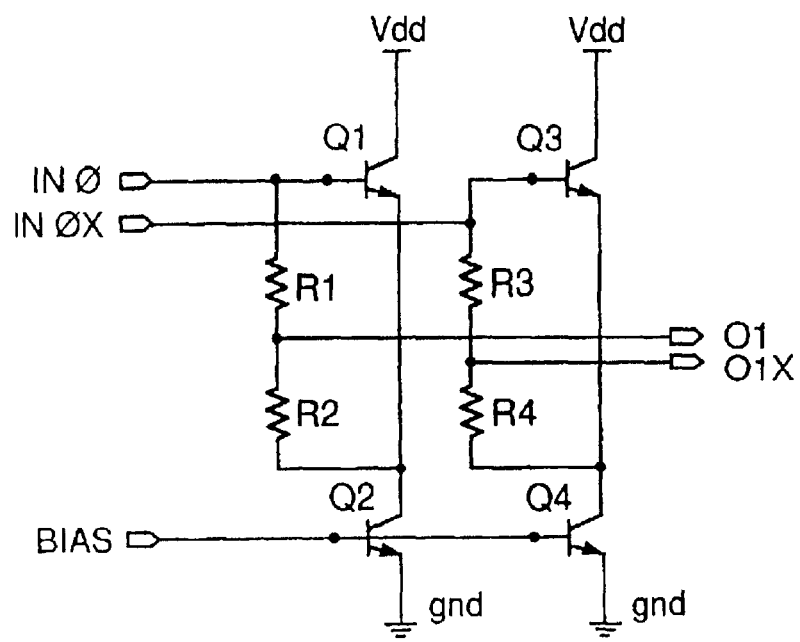
FIG. 3 is prior art schematic showing a voltage level shift circuit.
Figure 4:
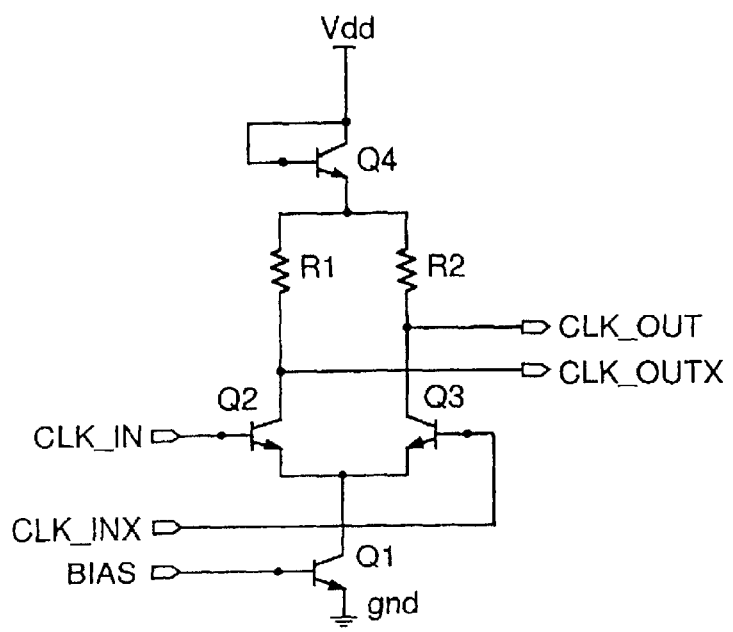
FIG. 4 is prior art schematic showing an alternative, wideband full diode drop level shift topology.
Figure 5:
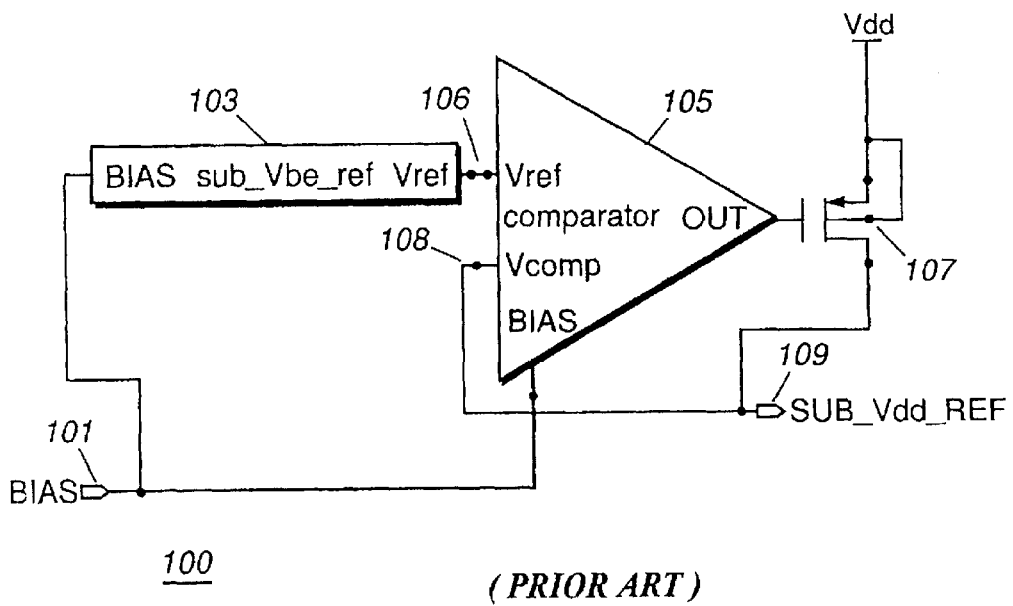
FIG. 5 is a block diagram of a prior art circuit that is a sub-Vbe voltage reference circuit, having a comparator, and current sourcing transistor.

Referring once again to the prior art circuit of FIG. 3, and for ease of explanation looking at only a portion of the circuit including Q1 and Q2 and the voltage divider circuit consisting of resistors R1 and R2 in series coupled between the base of Q1 and the emitter of Q1, it is evident that the voltage at the output terminal O1 is related to Vbe of Q1 and is scaled by the ratio of R1 and R2, such that if R1=R2 the voltage at O1=V(INO)−(Vbe/2). Although this accomplishes the desired effect of providing less than a full diode drop from input IN Ø to output O1, as was mentioned heretofore, the parasitic capacitance at the base of Q1 which in combination of the resistor R1 acts as a low-pass filter and severely limits the performance of the circuit.

Figure 6:
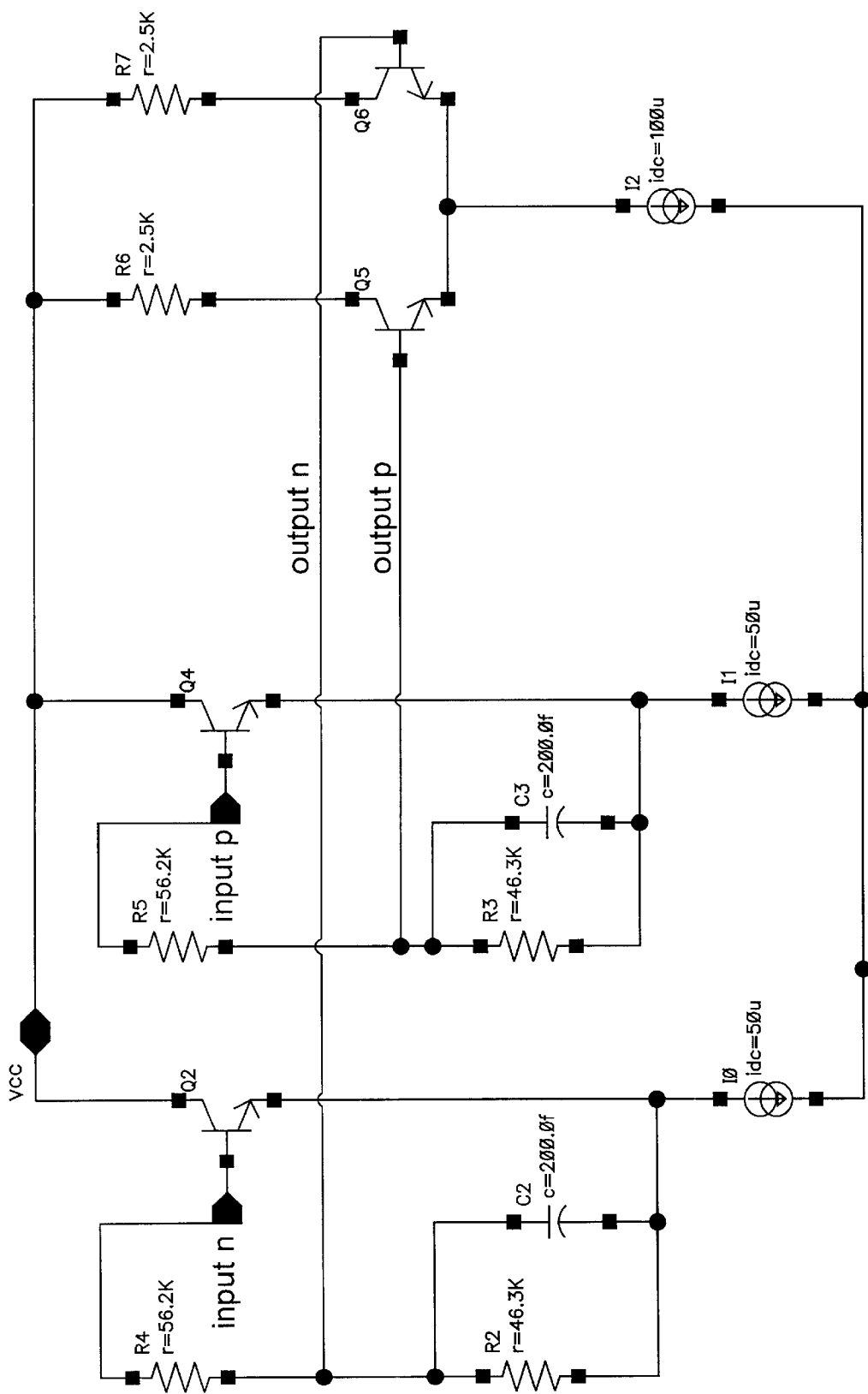
FIG. 6 is a is a schematic diagram of a sub-Vbe voltage level shift circuit in accordance with the invention which greatly improves upon the prior art circuit shown in FIG. 3.

A preferred exemplary embodiment of the invention shown in FIG. 6, which illustrates a dual level shifter that can be used with a CML circuit, that provides a solution which obviates much of the problem induced by effect of the unwanted low-pass filter formed by the RC circuit consisting of resistor R1 (FIG. 3) and the parasitic capacitance at the input of the transistor in the following stage. By the addition of capacitors C2 and C3 in this example having a value of 200 femto-Farads across the resistors R2 and R3 respectively, each having a resistance of 46.3 KΩ, effectively providing an alternative path for high frequency AC, a high-pass filter is formed which offsets the limitations of the unwanted low-pass filter. By providing the capacitor in parallel with resistor R3, the emitter rather than the base of transistor Q4 is loaded which is preferable since the impedance of the emitter is lower than that of the base. Notwithstanding, if the previous stage to the voltage level shifter has a very low output impedance, it may be preferable to provide the capacitor C3 across the resistor R5 or capacitors across both resistors.

Figure 7A:
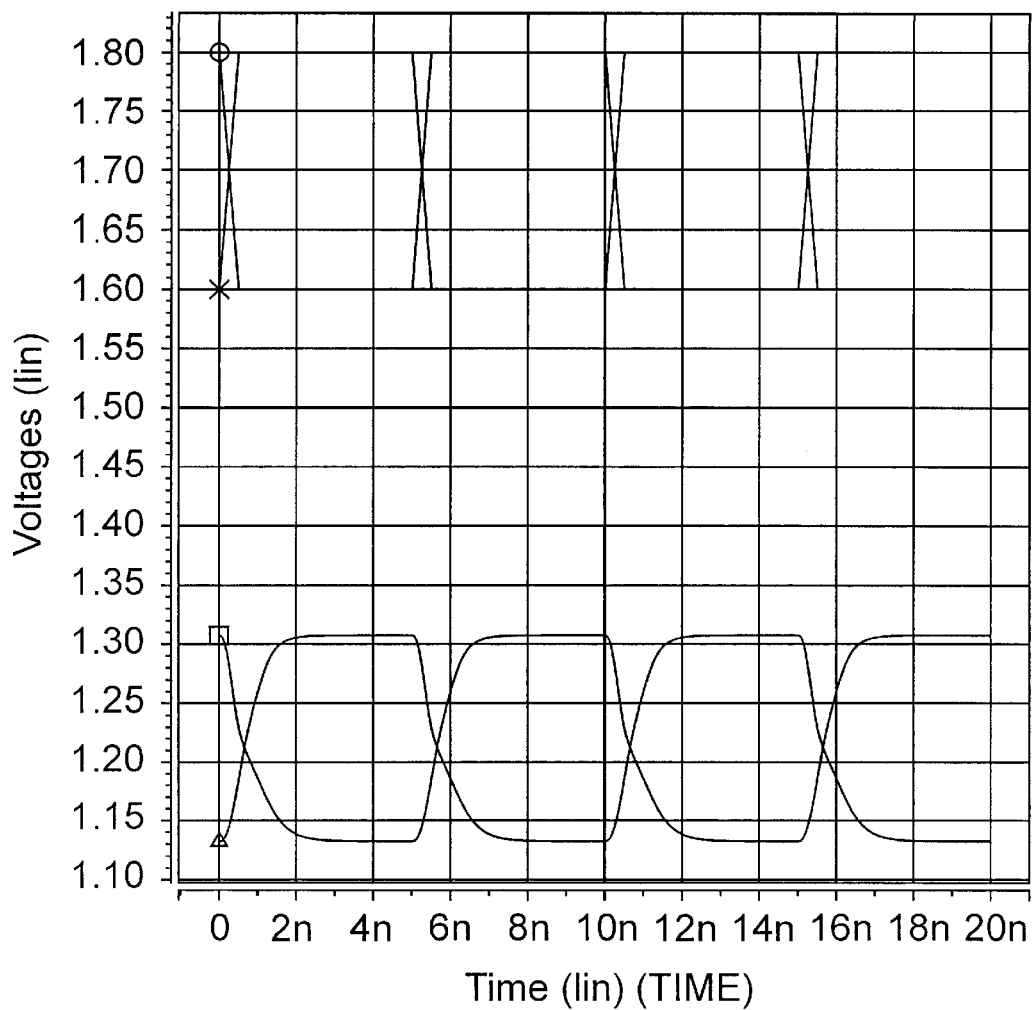
FIG. 7a is a graph of two plots showing a 100 MHz input signal and an output response of a prior art circuit absent additional capacitors across one of the voltage divider resistors.

FIG. 7a is a graph consisting of two simulated plots in the form of an input waveform above and an output waveform below for a 100 MHz input signal applied to the circuit of FIG. 6, absent the capacitors C2 and C3. The differential input signals are applied to the terminals in and ip of the transistors Q2 and Q4 respectively. The output signals are measured at terminals op and on.

Clearly, it can be seen that the output waveform is delayed and its substantially square shape is significantly degraded after it has effectively passed through a low-pass filter formed by the resistor parasitic capacitance combination.

Figure 7B:
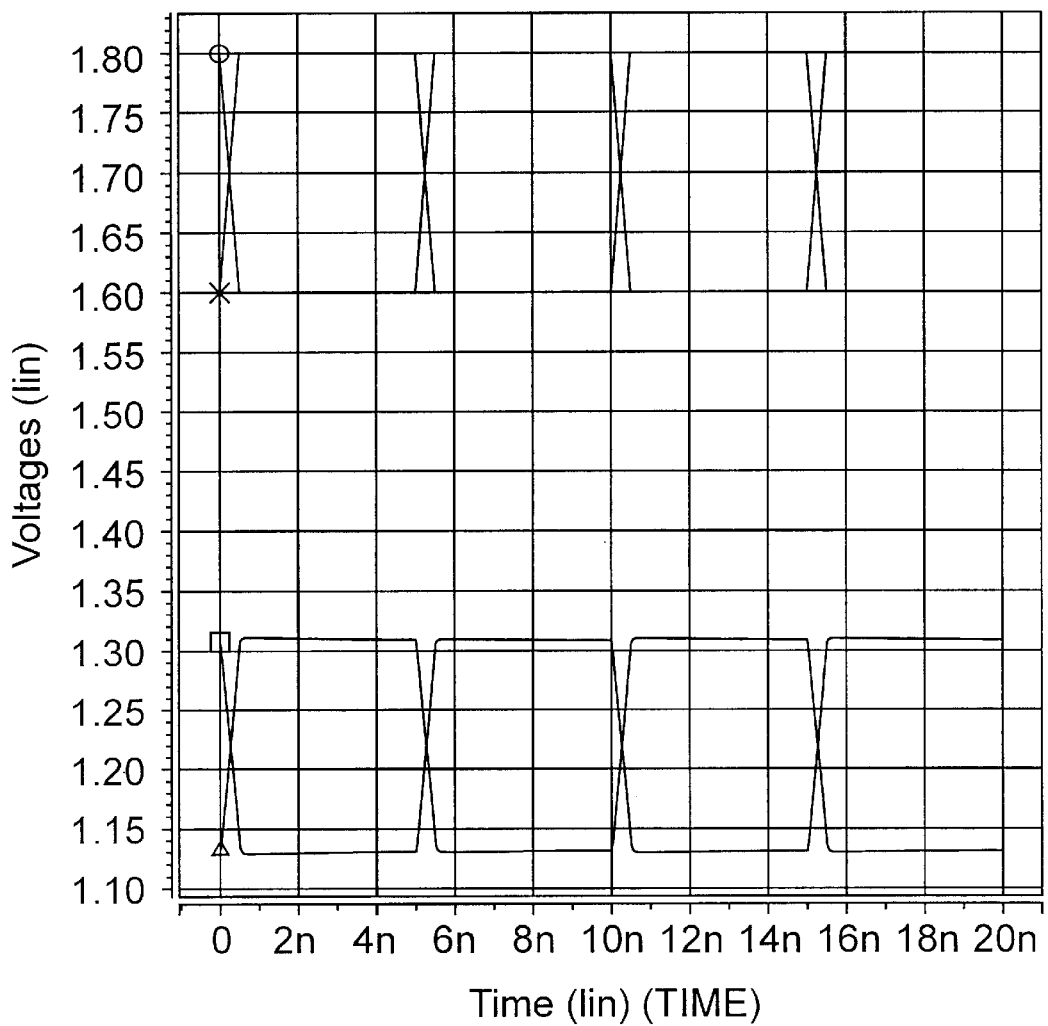
FIG. 7b is a graph of two plots showing a 100 MHz input signal and an output response of a prior art circuit having capacitors across one of the voltage divider resistors as is taught in accordance with this invention.

FIG. 7b is a graph consisting of two simulated plots in the form of an input waveform above and an output waveform below for the same 100 MHz input signal applied to the circuit of FIG. 6, as is shown in FIG. 7a with the capacitors C2 and C3 present. As with FIG. 7a, the differential input signals are applied to the terminals in and ip of the transistors Q2 and Q4 respectively. The output signals measured are at terminals op and on. It is immediately evident that by providing the capacitors C2 and C3 in accordance with this invention, the output response very closely tracks the input response. The delay between input and output is negligible and the waveform substantially retains its shape, from input to output.

Figure 8A:
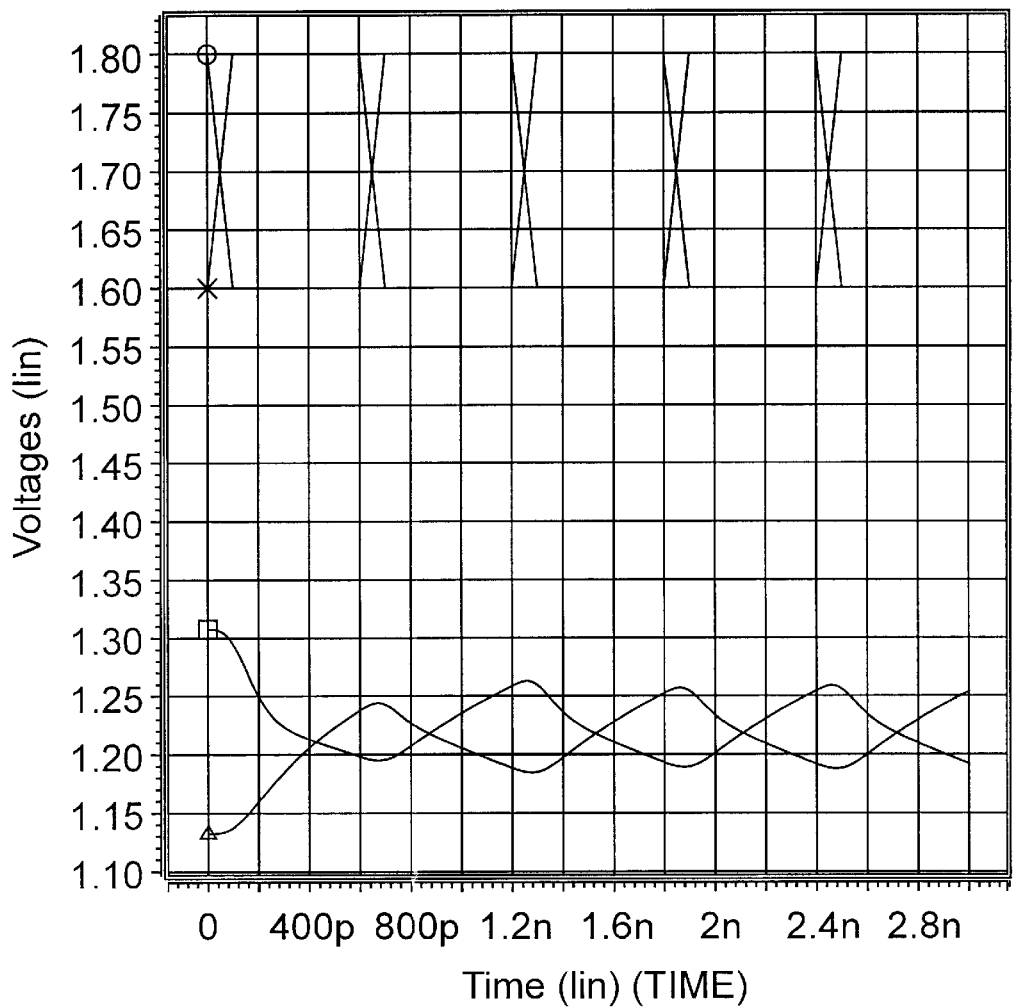
FIG. 8a is a graph of two plots showing a 800 MHz input signal and an output response of a prior art circuit absent additional capacitors across one of the voltage divider resistors.
Figure 8B:
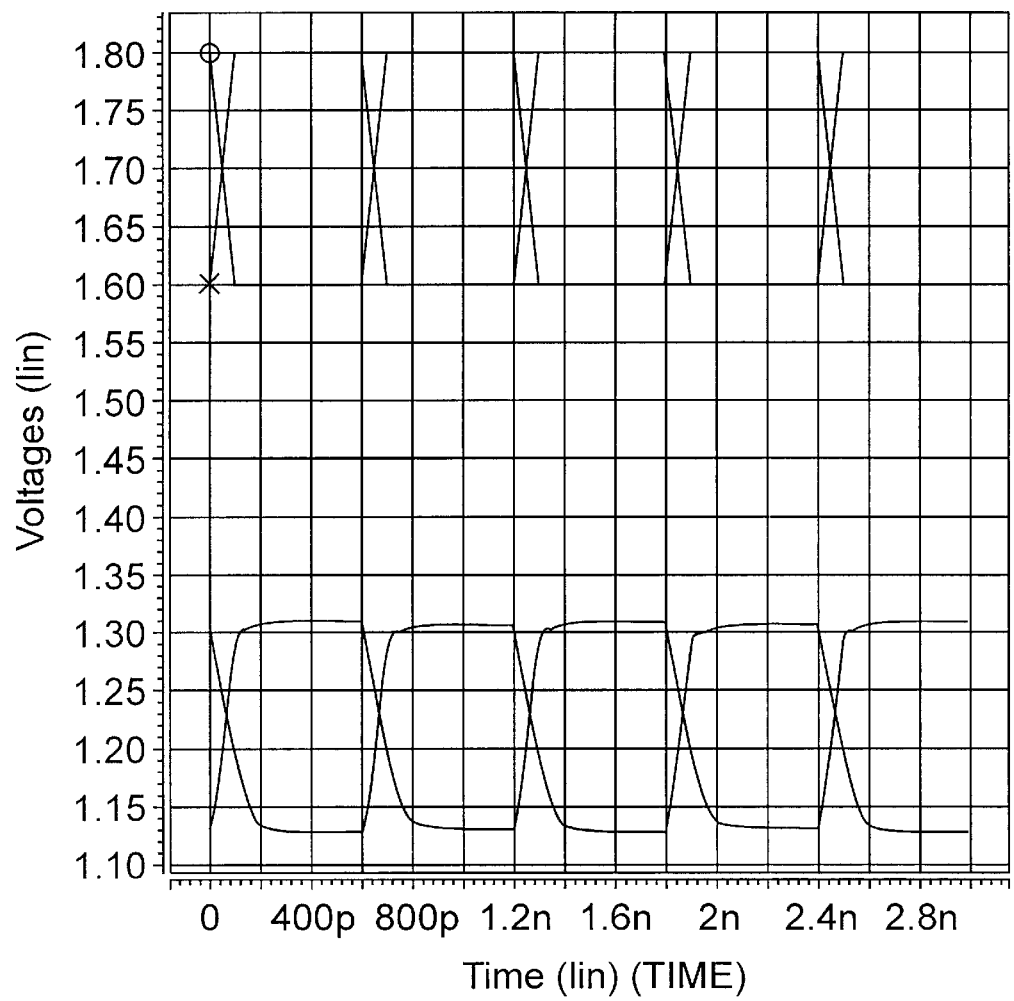
FIG. 8b is a graph of two plots showing a 800 MHz input signal and an output response of a prior art circuit having capacitors across one of the voltage divider resistors as is taught in accordance with this invention; and, FIG. 9 is a graph of a circuit in accordance with an aspect of this invention wherein Schottky diodes are used to provide a substantially constant voltage at collectors of a differential pair of a CML latch that is approximately 0.3 volts below a supply voltage, while allowing current to pass.

This effect is more accentuated in FIG. 8a and FIG. 8b where a higher frequency 800 MHz signal is applied. As a result of increasing the frequency and not providing the capacitors C2 and C3, the output response is substantially delayed in time and the output waveform is significantly more distorted than the output response of FIG. 7a. having little in common with the input signal from which it was generated.

Notwithstanding the improvement in the performance of the level shifter is indicated by viewing FIG. 8b wherein the capacitors C2 and C3 are used.

Thus, in accordance with this invention an inexpensive solution is possible. Providing capacitor C3 in parallel with the second resistor R3, greatly enhances the performance of the circuit of FIG. 6. Since this is a differential circuit having a differential pair Q5 and Q6, a practical embodiment of this particular circuit requires two level shifters each having an additional capacitor C2 and C3 respectively. Selecting the values of the capacitor depends in part on the values of the resistors R4, R2 and R5, R3, and is dependent upon the inherent parasitic capacitance of, for example transistors Q5 and Q6.

In a preferred embodiment of the invention the two resistors of the voltage divider pair have a resistance ratio of 1:1±30%.

Figure 9:
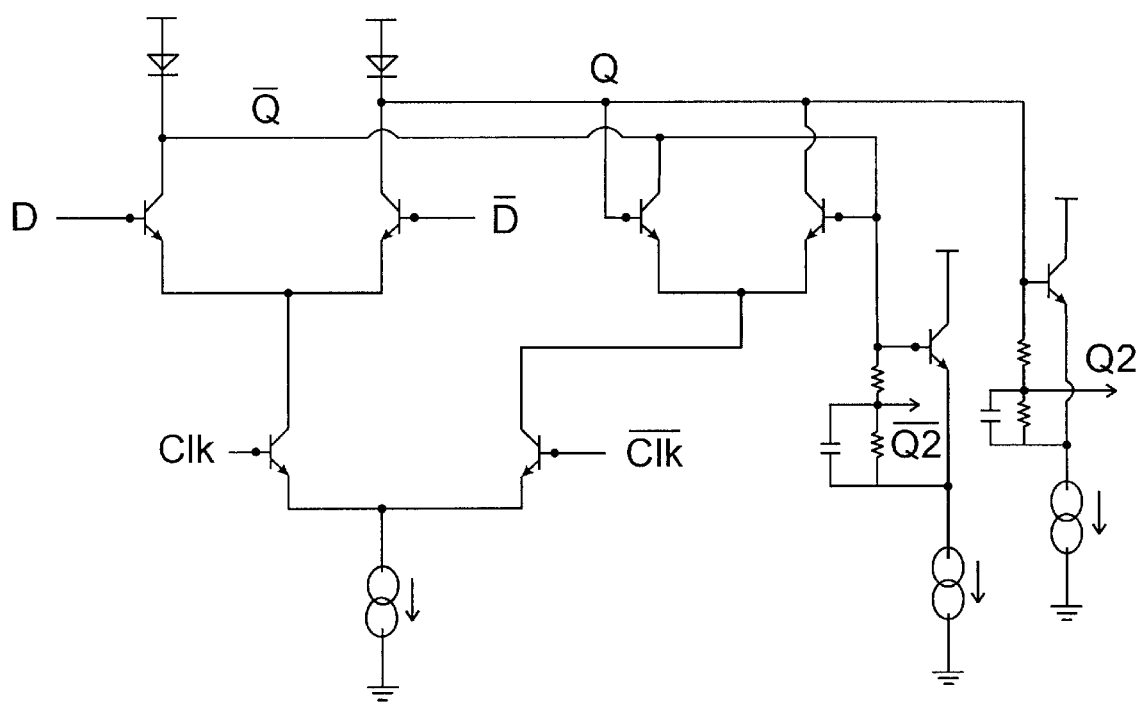

Turning now to FIG. 9, an alternative embodiment of the invention is shown including a CML latch with a level shifter circuit at its output. Q2 and Q2bar are a fraction of a diode drop lower than Q and Qbar. Schottky diodes provide a load at the input end of the circuit and replace conventional load resistors typically provided in conventional circuits.

Advantageously, Schottky diodes have a small fixed diode drop of 0.3 volts and substantially allow current to pass therethrough without being unduly limited. In contrast load resistors typically used to limit the current and have a variable voltage drop dependent upon the current that passes through. Having a current-dependent variable voltage swing can be deleterious to the operation of the circuit. Replacing the resistors with the Schottky shown diodes obviates the disadvantage of matching load resistors with resistors typically disposed downstream in-line. Another benefit of using a Schottky diode versus a conventional diode is its low voltage drop thereby allowing the collectors of the differential pair to be at a higher voltage.

Of course numerous other embodiments may be envisaged without departing from the spirit and scope of the invention.

What is claimed is:

1. A voltage level shifting circuit for use with an alternating current signal for providing a voltage offset up to a portion of a full diode voltage drop below a supply voltage, comprising:
   an input terminal for receiving the alternating current signal;
   a first and a second transistor connected in series, the first transistor having a collector, a base and an emitter, the base of the first transistor being connected to or serving as the input terminal, the second transistor being electrically coupled with the emitter of the first transistor, the base of the first transistor being coupled to the second transistor via a first and a second resistor in series forming a voltage divider network, the first resistor connected to the base of the first transistor, a node between the two resistors being an output terminal; and,
   a capacitor connected in parallel with one of the resistors for reducing high frequency impedance within the circuit.

2. A voltage level shifting circuit as defined in claim 1, wherein the capacitor is connected in parallel with the second resistor between the emitter of the first transistor and the node.

3. A voltage level shifting circuit as defined in claim 2, wherein the capacitor has a capacitance of less than or about 1 nF.

4. A voltage level shifting circuit as defined in claim 1, wherein the ratio of the resistances of the first and second resistors is within 30% of 1:1.

5. A voltage level shifting circuit as defined in claim 4, wherein the second transistor forms a part of a current source.

6. A voltage level shifting circuit as defined in claim 1, wherein the capacitor is connected between the base of the first transistor and the node such that it is in parallel with the first resistor.

7. A voltage level shifting circuit comprising:
   a first transistor having a collector, a base and an emitter, the collector for being coupled to a supply voltage, the base serving an input for an input signal to be level shifted; a voltage divider circuit coupled between the base and the emitter of the first transistor and having a node therebetween serving as an output node;
   a capacitor for reducing high frequency impedance in parallel with a portion of the voltage divider circuit.

8. A voltage divider circuit as defined in claim 7, wherein the capacitor is in parallel with only one resistor of voltage divider circuit and coupled to the emitter of the transistor and the node, the capacitor having a capacitance value less than 1 nF.

9. A current-mode level shifting circuit comprising:
   a first and a second input terminal;
   a first and a second transistor each having a collector, a base and an emitter, the collectors of the two transistors being coupled to a common voltage terminal, the base of the first and second transistor being coupled to the first and second input terminal respectively; the base of each of the first and second transistor being coupled to a voltage divider circuit, each voltage divider circuit comprising a first and a second resistor in series between the respective base and emitter of respective transistors, a node between each first and second resistors in series being output nodes; and,
   each voltage divider having a capacitor connected in parallel with one of the first and second series resistors for reducing the high frequency impedance of the circuit.

10. A current-mode level shifting circuit as defined in claim 9 further comprising a differential pair of transistors each having a base coupled to a different one of the output nodes.

11. A current-mode level shifting circuit as defined in claim 10 comprising two Schottky diodes, each diode coupled to a collector of the differential pair for providing a substantially constant voltage less than a circuit supply voltage at the respective collectors in operation.

12. A voltage level shifting circuit for use with an alternating current signal for providing a voltage offset up to a portion of a full diode voltage drop below a supply voltage, comprising:

an input terminal for receiving the alternating current signal;
   a first resistor coupled to the input terminal;
   a second resistor coupled in series to the first resistor and having a node therebetween forming an output terminal;
   a second transistor having a collector, a base and an emitter;
   a first transistor having a collector, a base and an emitter, the base of the first transistor being connected to or serving as the input terminal and being coupled to the base of the second transistor via the first and the second resistors in series forming a voltage divider network; and,
   a capacitor connected in parallel with one of the first and second resistors.

13. A voltage level shifting circuit as defined in claim 12, wherein the capacitor is connected in parallel with the second resistor between the emitter of the first transistor and the node.

14. A voltage level shifting circuit as defined in claim 13, wherein the capacitor has a capacitance of less than or about 1 nF.

15. A voltage level shifting circuit as defined in claim 12, wherein the ratio of the resistances of the first and second resistors is within 30% of 1:1.

16. A voltage level shifting circuit as defined in claim 15, wherein the second transistor forms a part of a current source.

* * * * *